US010495958B2

(12) United States Patent
Hanamura et al.

(10) Patent No.: US 10,495,958 B2
(45) Date of Patent: Dec. 3, 2019

(54) COOLING DEVICE AND PROJECTOR

(71) Applicant: Seiko Epson Corporation, Tokyo (JP)

(72) Inventors: Yuki Hanamura, Azumino (JP);
Tsukasa Funasaka, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/227,644

(22) Filed: Dec. 20, 2018

(65) Prior Publication Data
US 2019/0204722 A1 Jul. 4, 2019

(30) Foreign Application Priority Data

Dec. 28, 2017 (JP) ................................ 2017-254561

(51) Int. Cl.
G03B 21/16 (2006.01)
H05K 7/20 (2006.01)

(52) U.S. Cl.
CPC ........... *G03B 21/16* (2013.01); *H05K 7/2099* (2013.01); *H05K 7/20309* (2013.01); *H05K 7/20318* (2013.01); *H05K 7/20327* (2013.01); *H05K 7/20954* (2013.01)

(58) Field of Classification Search
CPC .... H05K 7/20; H05K 7/20145; H05K 7/2029; H05K 7/20309; H05K 7/20318; H05K 7/20327; H05K 7/20954; H05K 7/20963; H05K 7/2099; G03B 21/16
USPC ..................................................... 353/54, 61
See application file for complete search history.

(56) References Cited

U.S. PATENT DOCUMENTS

| 4,772,098 | A | * | 9/1988 | Ogawa | ............. G02F 1/133385 348/E5.141 |
| 5,032,021 | A | | 7/1991 | Kanatani et al. | |
| 10,216,074 | B2 | * | 2/2019 | Mikawa | ................ G03B 21/16 |
| 2005/0270495 | A1 | * | 12/2005 | Ohkubo | ................ G03B 21/18 353/54 |
| 2006/0196050 | A1 | * | 9/2006 | Fujimori | ............... B21D 53/08 29/890.035 |
| 2006/0279706 | A1 | * | 12/2006 | Bash | ...................... G03B 21/18 353/54 |

(Continued)

FOREIGN PATENT DOCUMENTS

| JP | H01-314287 A | 12/1989 |
| JP | H03-126011 A | 5/1991 |
| JP | H05-232432 A | 9/1993 |

(Continued)

*Primary Examiner* — William C. Dowling
(74) *Attorney, Agent, or Firm* — Harness, Dickey & Pierce, P.L.C.

(57) ABSTRACT

A cooling device of an optical element includes a circulation passage through which a fluid circulates. The circulation passage includes a window portion that is disposed on an incidence side or an emission side of the optical element and transmits light, an evaporation portion that is connected to the window portion and includes a plurality of channel portions, and a heat radiation portion that radiates heat of the fluid. The fluid transmits the light in a liquid state. The fluid is a liquid in the window portion. The fluid that is a liquid evaporates to vapor in the plurality of channel portions. The fluid that is vapor condenses into a liquid in the heat radiation portion. A sectional area of each channel portion is less than a sectional area of a boundary between the window portion and the evaporation portion.

20 Claims, 9 Drawing Sheets

(56) References Cited

U.S. PATENT DOCUMENTS

2008/0030688 A1* 2/2008 Lee .................. G03B 21/16
                                                353/54
2015/0198869 A1* 7/2015 Kuriaki .............. H01J 17/28
                                                353/31

FOREIGN PATENT DOCUMENTS

JP    2006-119493 A    5/2006
JP    2006-275501 A    10/2006

* cited by examiner

COOLING DEVICE AND PROJECTOR

BACKGROUND

1. Technical Field

The present invention relates to a cooling device and a projector.

2. Related Art

A large number of components that generate heat and are also susceptible to heat, such as a light source (for example, a lamp or a laser) and a liquid crystal panel, are used in a liquid crystal projector. Appropriately cooling these components is important in order to maintain the function of the projector. Thus, a cooling device that cools constituents is disposed in a casing of the projector.

A cooling device that cools a polarization plate using freon or water is disclosed in, for example, JP-A-1-314287. This cooling device includes a circulation passage through which a fluid of freon, water, or the like circulates. The circulation passage includes a window portion that transmits light. The polarization plate is cooled in the window portion.

A cooling device that uses latent heat is known as a cooling device. In such a cooling device, a vapor-liquid interface (an interface between a vapor phase and a liquid phase) of a fluid is present in a circulation passage through which a cooling fluid circulates.

In a cooling device including a window portion as described above, a change in the flow rate of the fluid may move the vapor-liquid interface of the fluid to the vicinity of the window portion, and light may be scattered by air bubbles generated in the vicinity of the vapor-liquid interface. Consequently, a video on the projector may be distorted.

SUMMARY

An advantage of some aspects of the invention is provision of a cooling device that can reduce the effect of air bubbles on light transmitted through a window portion. Another advantage of some aspects of the invention is provision of a projector that includes the cooling device.

A cooling device according to an aspect of the invention is a cooling device for cooling an optical element, and includes a circulation passage through which a fluid circulates. The circulation passage includes a window portion that is disposed on an incidence side or an emission side of the optical element and transmits light, an evaporation portion that is connected to the window portion and includes a plurality of channel portions, and a heat radiation portion that radiates heat of the fluid. The window portion, the evaporation portion, and the heat radiation portion are disposed in an order of the window portion, the evaporation portion, and the heat radiation portion in a circulation direction of the fluid. The fluid transmits the light in a liquid state. The fluid is a liquid in the window portion. The fluid that is a liquid evaporates to vapor in the plurality of channel portions. The fluid that is vapor condenses into a liquid in the heat radiation portion. A sectional area of each channel portion is less than a sectional area of a boundary between the window portion and the evaporation portion.

In such a cooling device, a loss of pressure of the fluid in the boundary between the window portion and the evaporation portion is increased, and a vapor-liquid interface of the fluid can be maintained in the channel portions. Furthermore, since the plurality of channel portions are disposed, an area of contact between the stack body defining the evaporation portion and a liquid part of the fluid can be increased in the evaporation portion. Thus, the vapor-liquid interface can be maintained in the channel portions by interface tension in the interface between the stack body defining the evaporation portion and the liquid part of the fluid. Therefore, in such a cooling device, it is unlikely that the vapor-liquid interface moves to the window portion side, and the effect of air bubbles generated in the vicinity of the vapor-liquid interface on the light transmitted through the window portion can be reduced.

In the cooling device, the sectional area of each channel portion may be greater than or equal to 0.008 $mm^2$ and less than or equal to 0.1 $mm^2$, and the sectional area of the boundary between the window portion and the evaporation portion may be greater than or equal to 1.2 $mm^2$ and less than or equal to 55 $mm^2$.

In such a cooling device, the vapor-liquid interface can be more securely maintained in the channel portions.

In the cooling device, a pump that transports the fluid to the window portion may be disposed in a part of the circulation passage that connects the heat radiation portion and the window portion.

In such a cooling device, since the pump is disposed, it is unlikely that the vapor-liquid interface moves even in a case where the attitude of the cooling device changes.

In the cooling device, an orifice that controls a flow rate of the fluid may be disposed in the part of the circulation passage that connects the heat radiation portion and the window portion.

In such a cooling device, the flow rate of the fluid can be controlled by the orifice such that the vapor-liquid interface is present in the channel portions and the heat radiation portion.

In the cooling device, the circulation passage may include a liquid transport portion in which the pump is disposed, and the orifice may be disposed in a part of the circulation passage that connects the heat radiation portion and the liquid transport portion.

In such a cooling device, the flow rate of the fluid can be controlled such that the vapor-liquid interface is present in the heat radiation portion.

The cooling device may further include a control portion that controls the orifice, and a flowmeter that measures the flow rate of the fluid. The control portion may control the orifice depending on output of the flowmeter.

In such a cooling device, the opening of the orifice can be controlled by the control portion such that the flow rate measured by the flowmeter is constant.

The cooling device may further include a control portion that controls the orifice, and a liquid level gauge that measures a height of a liquid surface of the fluid in the heat radiation portion. The control portion may control the orifice depending on output of the liquid level gauge.

In such a cooling device, the opening of the orifice can be controlled by the control portion such that the height of the vapor-liquid interface measured by the liquid level gauge does not change.

The cooling device may further include a stack body in which a plurality of substrates are stacked. The circulation passage may be disposed in the stack body, and the window portion, the evaporation portion, and the heat radiation portion may be disposed inside the stack body.

In such a cooling device, the window portion, the evaporation portion, and the heat radiation portion can be formed as a single body. Accordingly, in such a cooling device, the number of components for forming the circulation passage can be reduced, compared to that in a case where the window portion, the evaporation portion, and the heat radiation portion are not formed as a single body. Therefore, the size of such a cooling device can be reduced.

In the cooling device, a first groove portion that constitutes the circulation passage may be disposed in a first substrate among the plurality of substrates.

In such a cooling device, the circulation passage can be easily formed by simply working the first substrate.

In the cooling device, a second groove portion that constitutes the circulation passage may be disposed in a second substrate among the plurality of substrates, and the first groove portion and the second groove portion may overlap in a plan view seen from a stack direction of the plurality of substrates.

In such a cooling device, the circulation passage having a desired sectional area can be formed without increasing the depth of the first groove portion. Therefore, for example, such a cooling device can include the first substrate that is solid.

A projector according to an aspect of the invention includes the cooling device.

In such a projector, the cooling device can be included.

In the projector, the optical element may be a liquid crystal panel.

In such a projector, the cooling device can cool the liquid crystal panel.

In the projector, three optical elements may be disposed, and three cooling devices may be disposed in correspondence with the three optical elements.

In such a projector, the cooling device can cool the liquid crystal panel.

In the projector, a common pump that transports the fluid to the window portions may be disposed in the circulation passages of the three cooling devices, and an orifice that controls a flow rate of the fluid may be disposed in each circulation passage of the three cooling devices.

In such a projector, the number of pumps can be reduced, compared to that in a case where three pumps are disposed, and the flow rate of the fluid flowing through three window portions can be controlled by three orifices.

In the projector, the optical element may be a polarization plate.

In such a projector, the cooling device can cool the polarization plate.

In the projector, a plurality of the optical elements may be disposed, a first optical element among the plurality of optical elements may be a liquid crystal panel, a second optical element among the plurality of optical elements may be a polarization plate, and the window portion may be disposed between the first optical element and the second optical element.

In such a projector, the cooling device can cool the liquid crystal panel and the polarization plate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described in detail using the drawings. The exemplary embodiments described below do not unduly limit the content of the invention disclosed in the appended claims. Not all configurations described below are necessary constituents of the invention.

1. First Embodiment 1.1. Cooling Device

Figure 1:
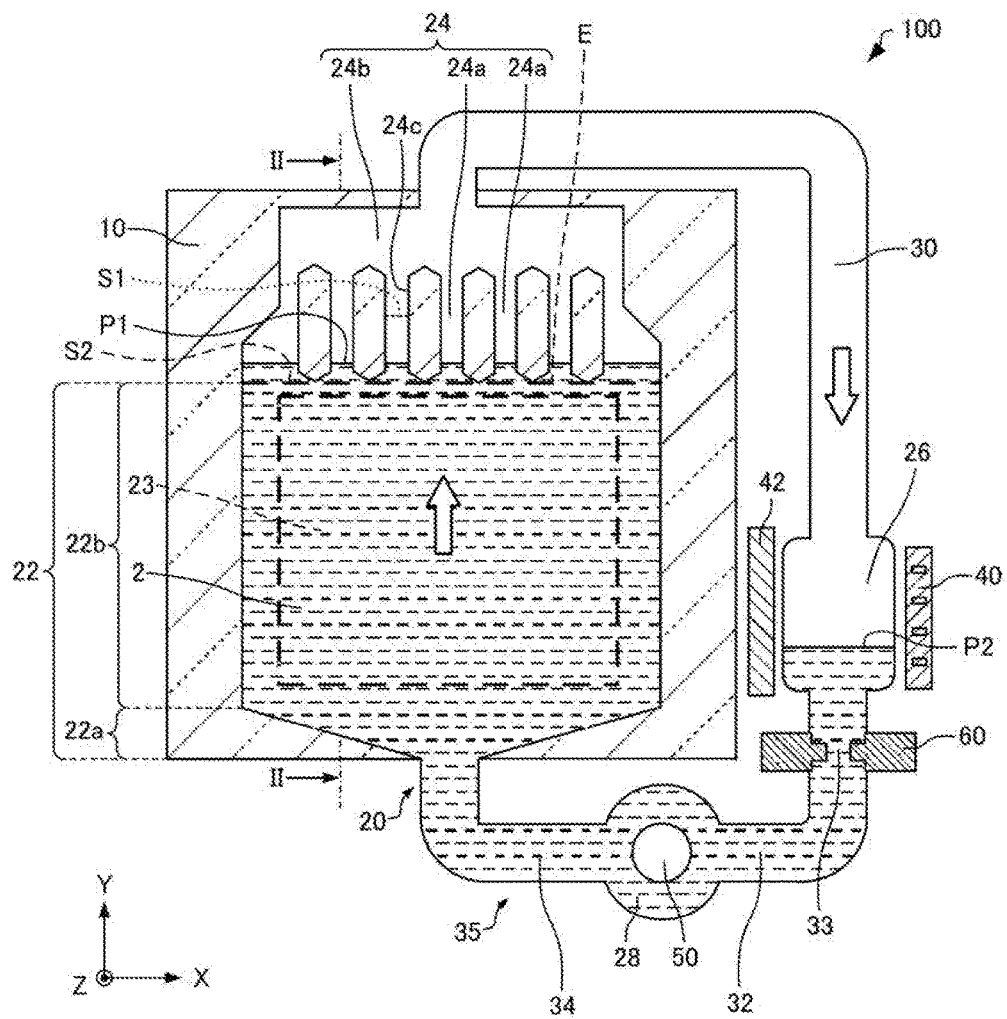
FIG. 1 is a sectional view schematically illustrating a cooling device according to a first embodiment.
Figure 2:
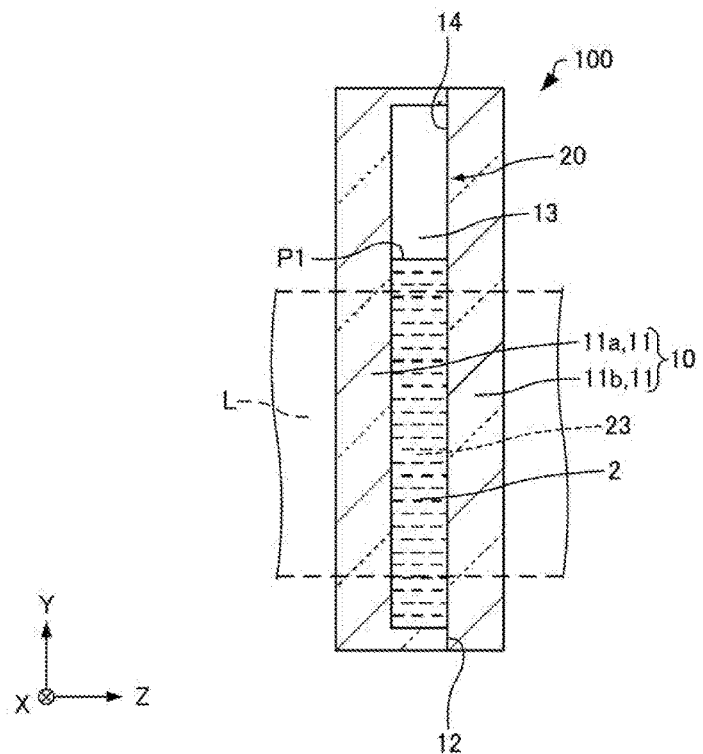
FIG. 2 is a sectional view schematically illustrating the cooling device according to the first embodiment.

First, a cooling device according to a first embodiment will be described with reference to the drawings. FIG. 1 is a sectional view schematically illustrating a cooling device 100 according to the first embodiment. FIG. 2 is an II-II sectional view of FIG. 1 schematically illustrating the cooling device 100 according to the first embodiment. In FIGS. 1 and 2 and FIG. 5 to FIG. 9 described below, an X axis, a Y axis, and a Z axis are illustrated as three axes that are orthogonal to each other.

The cooling device 100 is a cooling device for cooling an optical element (not illustrated in FIG. 1 and FIG. 2). The cooling device 100 includes, for example, a stack body 10 as illustrated in FIG. 1 and FIG. 2.

The stack body 10 is configured by stacking a plurality of substrates. In the illustrated example, the stack body 10 includes a first substrate 11a and a second substrate 11b and is configured by stacking the first substrate 11a and the second substrate 11b. The first substrate 11a is a first substrate among a plurality of substrates 11, and the second substrate 11b is a second substrate among the plurality of substrates 11. The first substrate 11a and the second substrate 11b are stacked in the Z axis direction. The first substrate 11a and the second substrate 11b are joined to each other by, for example, an adhesive. The first substrate 11a and the second substrate 11b are, for example, glass substrates. The first substrate 11a and the second substrate 11b transmit light L. For example, in a case where the cooling device 100 is used in a projector, the light L is light emitted from a light source of the projector.

A circulation passage 20 through which a fluid 2 that transmits the light L circulates is disposed in the stack body 10. The cooling device 100 includes the circulation passage 20. In the illustrated example, a part of the circulation passage 20 is disposed in the stack body 10. For example, a first groove portion 13 that constitutes a part of the circulation passage 20 is disposed in the first substrate 11a. The first groove portion 13 is disposed on a first surface 12 of the first substrate 11a. The second substrate 11b includes a second surface 14. The second surface 14 is joined to the first surface 12.

In the circulation passage 20, the fluid 2 circulates in the direction of an arrow (clockwise direction) illustrated in FIG. 1. The fluid 2 is not particularly limited, provided that the fluid 2 can transmit the light L and cool the optical element. The fluid 2 is, for example, water. The fluid 2 transmits the light L in a liquid state. The fluid 2 cools the optical element using, for example, latent heat. The fluid 2 may transmit only a part of the light L or may transmit the whole light L. The fluid 2 is not limited to water. Alcohol such as methanol or ethanol, an HFO-based refrigerant such as R1234yf, an HFC-based refrigerant such as R32 or R134a, freon, Fluorinert, hydrocarbon such as propane or isobutane, carbon dioxide, or the like, or a mixture of two or more kinds thereof may be used as the fluid 2.

The size of the circulation passage 20 in the Z axis direction (in the illustrated example, the depth of the first groove portion 13) is, for example, greater than or equal to 0.1 mm and less than or equal to 1 mm and preferably, equal to 0.2 mm. In a case where the size of the circulation passage 20 in the Z axis direction is less than or equal to 1 mm, convection currents caused by a temperature distribution of the fluid 2 can be reduced.

The circulation passage 20 includes, for example, a window portion 22, an evaporation portion 24, a heat radiation portion 26, a liquid transport portion 28, a first connection portion 30, a second connection portion 32, and a third connection portion 34. The window portion 22, the evaporation portion 24, the first connection portion 30, the heat radiation portion 26, the second connection portion 32, the liquid transport portion 28, and the third connection portion 34 are disposed in the circulation direction of the fluid 2 in an order of the window portion 22, the evaporation portion 24, the first connection portion 30, the heat radiation portion 26, the second connection portion 32, the liquid transport portion 28, and the third connection portion 34.

The window portion 22 is disposed on the incidence side or the emission side of the optical element and transmits the light L. In a case where the window portion 22 is disposed on the incidence side of the optical element with respect to the light L, the light L is transmitted through the window portion 22 and then, is incident on the optical element. In a case where the window portion 22 is disposed on the emission side of the optical element with respect to the light L, the light L passes through the optical element and then, is incident on the window portion 22. The window portion 22 may transmit only a part of the light L or may transmit the whole light L.

The sectional area of the window portion 22 is, for example, greater than the sectional area of the connection portion 30, 32, or 34. The "sectional area" is a sectional area in a case where a plane that is orthogonal to the circulation direction of the fluid 2 is the cutting plane. The shape of the sectional area of the window portion is not particularly limited and is, for example, an oblong shape. In the illustrated example, the window portion 22 includes a first part 22a and a second part 22b. The first part 22a is connected to the third connection portion 34 and has a sectional area that is gradually increased in the direction of flow of the fluid 2. The second part 22b is connected to the first part 22a and the evaporation portion 24 and has a constant sectional area. In the illustrated example, the circulation direction of the fluid 2 in the window portion 22 and the evaporation portion 24 is the +Y axis direction.

The window portion 22 includes a light irradiation portion 23 that is irradiated with the light L. In the illustrated example, the second part 22b includes the light irradiation portion 23. For example, the light irradiation portion 23 is a part that overlaps with the optical element in a plan view seen from the stack direction of the plurality of substrates 11 (in the illustrated example, the Z axis direction).

The shape of the light irradiation portion 23 of the window portion 22 is, for example, a rectangular parallelepipedal shape. The maximum size of the light irradiation portion 23 in the X axis direction is, for example, greater than or equal to 10 mm and less than or equal to 50 mm and preferably, equal to 32 mm. The maximum size of the light irradiation portion 23 in the Y axis direction is, for example, greater than or equal to 5 mm and less than or equal to 40 mm and preferably, less than or equal to 15 mm. The maximum size of the light irradiation portion 23 in the Z axis direction is, for example, greater than or equal to 0.1 mm and less than or equal to 1 mm and preferably, equal to 0.2 mm. The maximum sectional area of the light irradiation portion 23 is, for example, greater than or equal to 1 $mm^2$ and less than or equal to 50 $mm^2$ and preferably, equal to 6.4 $mm^2$.

In the window portion 22, the fluid 2 is a liquid. In the window portion 22, the fluid 2 cools the optical element, and the temperature of the fluid 2 is increased.

The evaporation portion 24 is connected to the window portion 22. In the evaporation portion 24, the fluid evaporates. The evaporation portion 24 includes, for example, a plurality of channel portions 24a and a connection portion 24b that connects the plurality of channel portions 24a to each other. Each channel portion 24a is formed by a partition portion 24c. Each partition portion 24c is, for example, a surface of the stack body 10.

A sectional area S1 of each channel portion 24a is less than a sectional area S2 of a boundary E between the window portion 22 and the evaporation portion 24. In the illustrated example, the sectional area S1 is the sectional area of each channel portion 24a in a plane parallel to the XZ plane. The sectional area S2 is the sectional area of the boundary E in a plane parallel to the XZ plane. The sectional area S1 is, for example, the minimum sectional area of each channel portion 24a. The maximum sectional area of each channel portion 24a is less than the sectional area S2. The shape of the sectional area of each channel portion 24a is a polygonal shape such as an oblong shape or a square shape. The sectional area S1 is, for example, less than the sectional area of the connection portion 30, 32, or 34. The shape of the sectional area of each channel portion 24a is not particularly limited and may be a circular shape, an elliptic shape, or the like.

In the illustrated example, the boundary E between the window portion 22 and the evaporation portion 24 is the section of the evaporation portion 24 that includes the furthermost portion of the partition portion 24c on the window portion 22 side in a plan view in a plane parallel to the XZ plane. The size of the boundary E between the window portion 22 and the evaporation portion 24 in the X axis direction is, for example, greater than or equal to 12 mm and less than or equal to 55 mm and preferably, equal to 35 mm. The size of the boundary E in the Z axis direction is, for example, greater than or equal to 0.1 mm and less than or equal to 1 mm and preferably, equal to 0.2 mm. The sectional area of the boundary E is, for example, greater than or equal to 1.2 mm$^2$ and less than or equal to 55 mm$^2$ and preferably, equal to 7 mm$^2$. While the boundary E and the window portion 22 have the same sectional shape and the same sectional area in the illustrated example, the invention is not limited thereto. The boundary E and the window portion 22 may have different sectional shapes and different sectional areas.

The minimum size of each channel portion 24a in the Y axis direction is greater than the minimum size of each channel portion 24a in the X axis direction and the minimum size of each channel portion 24a in the Z axis direction. The minimum size of each channel portion 24a in the X axis direction is, for example, greater than or equal to 0.05 mm and less than or equal to 0.5 mm and preferably, equal to 0.2 mm. The sectional area S1 of each channel portion 24a is, for example, greater than or equal to 0.008 mm$^2$ and less than or equal to 0.1 mm$^2$. Specifically, for example, the sectional area S1 of each channel portion 24a is greater than or equal to 0.008 mm$^2$ and less than or equal to 0.785 mm$^2$ in a case where its shape is a circular shape, and is greater than or equal to 0.01 mm$^2$ and less than or equal to 0.1 mm$^2$ in a case where its shape is a square shape. The minimum size of each channel portion 24a in the Y axis direction is, for example, greater than or equal to 0.5 mm and less than or equal to 5 mm and preferably, less than or equal to 1 mm. The number of channel portions 24a is not limited, provided that the number of channel portions 24a is plural. For example, the number of channel portions 24a is greater than or equal to 2 and less than or equal to 50 and preferably, equal to 30. For example, the fluid 2 flows in the +Y axis direction in each channel portion 24a.

In each channel portion 24a, the fluid 2 that is a liquid receives heat from the optical element (conductive heat transferred from the optical element) in the window portion 22 and each channel portion 24a and evaporates to vapor. Thus, in each channel portion 24a, a vapor-liquid interface (an interface between a vapor phase and a liquid phase; a liquid surface) P1 of the fluid 2 is present, and the window portion 22 is sealed in water. Accordingly, the temperature of the fluid 2 in the window portion 22 is maintained at around a vapor-liquid equilibrium temperature corresponding to the internal pressure of the circulation passage 20.

The sectional area of the connection portion 24b is greater than the sectional area of each channel portion 24a. The sectional area of the connection portion 24b is, for example, greater than the sectional area of the connection portion 30, 32, or 34. In the connection portion 24b, the fluid 2 is vapor. The evaporation portion 24 is, for example, a microchannel heat exchanger.

The sectional area of the heat radiation portion 26 is, for example, greater than the sectional area of the connection portion 30, 32, or 34. The first connection portion 30 connects the evaporation portion 24 and the heat radiation portion 26 to each other. In the heat radiation portion 26, the heat of the fluid 2 is radiated. A heat exchanger 40 is disposed in the vicinity of the heat radiation portion 26. In the illustrated example, the heat exchanger 40 is disposed on the +X axis direction side of the heat radiation portion 26. The heat exchanger 40 radiates the heat of the fluid 2 in the heat radiation portion 26. The heat exchanger 40 is, for example, a double pipe heat exchanger performing heat exchange inside and outside double pipes, a shell and tube heat exchanger incorporating multiple tubes (heat transfer pipes) in a shell (torso), or a heat sink. In a case where the heat exchanger 40 is a heat sink, a fan (not illustrates) that blows wind to the heat exchanger 40 may be disposed.

In the heat radiation portion 26, the latent heat of the fluid 2 is radiated by the heat exchanger 40. Thus, the fluid 2 that is vapor is condensed to a liquid. Thus, in the heat radiation portion 26, a vapor-liquid interface P2 of the fluid 2 is present, and the second connection portion 32 is sealed in water. The vapor-liquid interface P2 is maintained in the heat radiation portion 26 by an orifice 60 and a pump 50.

A heat insulation portion 42 is disposed between the heat radiation portion 26 and the window portion 22. The heat insulation portion 42 can reduce transfer of heat radiated from the heat radiation portion 26 to the window portion 22. The material of the heat insulation portion 42 is, for example, a known heat insulation material. The heat insulation portion 42 may be a through hole that passes through the stack body 10 in the Z axis direction.

The liquid transport portion 28 is a part in which force for transporting the fluid 2 to the window portion 22 is exerted on the fluid 2. The second connection portion 32 connects the heat radiation portion 26 and the liquid transport portion 28 to each other. The third connection portion 34 connects the liquid transport portion 28 and the window portion 22 to each other. The liquid transport portion 28 and the connection portions 32 and 34 constitute a part 35 of the circulation passage 20 that connects the heat radiation portion 26 and the window portion 22 to each other. The sectional area of the liquid transport portion 28 is, for example, greater than the sectional area of the connection portion 30, 32, or 34.

In the liquid transport portion 28, the fluid 2 is a liquid. The pump 50 is disposed in the liquid transport portion 28. The cooling device 100 includes the pump 50. The pump 50 transports the fluid 2 to the window portion 22. The pump 50 is, for example, a diaphragm pump that uses a piezoelectric effect.

The orifice 60 is disposed in the part 35 of the circulation passage 20 that connects the heat radiation portion 26 and the window portion 22 to each other. Specifically, the orifice 60 is disposed in the second connection portion 32. The orifice 60 controls the flow rate (amount of movement per unit time period) of the fluid 2 flowing through the circulation passage 20. The cooling device 100 includes, for example, the orifice 60. The orifice 60 causes the second connection portion 32 to include a narrowed portion 33. The structure of the orifice 60 is not particularly limited, provided that the narrowed portion 33 can be formed. For example, the orifice 60 is configured by disposing a through hole in a plate-shaped member.

The sectional area of the narrowed portion 33 formed by the orifice 60 is less than the sectional area of the part of the second connection portion 32 other than the narrowed portion 33 (the other part of the second connection portion 32). The section of the second connection portion 32 in a plane parallel to the XZ plane may have a circular shape or may have a polygonal shape. The diameter of the narrowed portion 33 is, for example, greater than or equal to 0.1 mm and less than or equal to 1.5 mm and preferably, equal to 0.2 mm. The narrowing ratio of the orifice 60 (the sectional area of the orifice 60/the sectional area of the other part of the second connection portion 32) is greater than or equal to 0.02 and less than or equal to 0.3 and preferably, equal to 0.04. The diameter of the other part of the second connection portion 32 is, for example, greater than or equal to 0.5 mm and less than or equal to 5 mm and preferably, equal to 1 mm.

The "diameter of the narrowed portion 33" is a diameter in a case where the sectional shape of the narrowed portion 33 is a circular shape. In a case where the sectional shape of the narrowed portion 33 is a polygonal shape, the diameter of the narrowed portion 33 can be obtained using Expression (1). In Expression (1), the "wetted perimeter" refers to the perimeter of a passage wall surface that is in contact with the fluid. For example, in a case where the passage has a sectional shape of an oblong shape having a length L1 of its long edge and a length L2 of its short edge, the wetted perimeter is "2×L1+2×L2". The same applies to the "diameter of the other part of the second connection portion 32".

(Diameter of narrowed portion 33)=4×(Sectional area of narrowed portion 33)/(Wetted perimeter of narrowed portion 33)  (1)

The size of the area of the opening of the orifice 60 (the sectional area of the narrowed portion 33) and the output of the pump 50 are determined such that the vapor-liquid interface P1 is present in each channel portion 24a, and the vapor-liquid interface P2 is present in the heat radiation portion 26.

The cooling device 100 may include a pump control portion (not illustrated) controlling the pump 50 and an attitude detection portion (not illustrated) detecting information related to the attitude of the cooling device 100. The pump control portion may control the output of the pump 50 depending on the output of the attitude detection portion such that the vapor-liquid interface P1 is present in each channel portion 24a, and the vapor-liquid interface P2 is present in the heat radiation portion 26. Accordingly, a change in the cooling efficiency of the cooling device 100 caused by the attitude of the cooling device 100 can be reduced. The "attitude of the cooling device 100" is, for example, an angle between the direction of gravity and a direction in which the light L transmitted through the window portion 22 travels.

For example, the window portion 22 and the evaporation portion 24 of the circulation passage 20 are formed by working (for example, etching) the first substrate 11a. The window portion 22 and the evaporation portion 24 are disposed inside the stack body 10. The heat radiation portion 26, the liquid transport portion 28, and the connection portions 30, 32, and 34 of the circulation passage 20 may be formed by connecting a substrate (not illustrated) in which the heat radiation portion 26, the liquid transport portion 28, and the connection portions 30, 32, and 34 are formed to the stack body 10, or may be formed by connecting a pipe to the stack body 10.

For example, the cooling device 100 has the following features.

In the cooling device 100, the sectional area S1 of each channel portion 24a is less than the sectional area S2 of the boundary E between the window portion 22 and the evaporation portion 24. Thus, in the cooling device 100, a loss of pressure of the fluid 2 in the boundary E is increased, compared to that in a case where the sectional area S1 is greater than or equal to the sectional area S2, and the vapor-liquid interface P1 of the fluid 2 can be maintained in each channel portion 24a. Furthermore, since the plurality of channel portions 24a are disposed, the area of contact between the stack body 10 defining the evaporation portion 24 and the liquid part of the fluid 2 can be increased in the evaporation portion 24. Thus, the vapor-liquid interface P1 can be maintained in each channel portion 24a by interface tension in the interface between the stack body 10 defining the evaporation portion 24 and the liquid part of the fluid 2.

Therefore, in the cooling device 100, it is unlikely that the vapor-liquid interface P1 moves to the window portion 22 side, and the effect of air bubbles generated in the vicinity of the vapor-liquid interface P1 on the light L transmitted through the window portion 22 can be reduced.

In the cooling device 100, the sectional area of each channel portion 24a is greater than or equal to 0.008 mm$^2$ and less than or equal to 0.1 mm$^2$, and the sectional area of the boundary E between the window portion 22 and the evaporation portion 24 is greater than or equal to 1.2 mm$^2$ and less than or equal to 55 mm$^2$. Thus, in the cooling device 100, the vapor-liquid interface P1 can be more securely maintained in each channel portion 24a.

In the cooling device 100, the pump 50 that transports the fluid 2 to the window portion 22 is disposed in the part 35 of the circulation passage 20 that connects the heat radiation portion 26 and the window portion 22 to each other. Thus, in the cooling device 100, it is unlikely that the vapor-liquid interfaces P1 and P2 move even in a case where the attitude of the cooling device 100 changes.

In the cooling device 100, the orifice 60 that controls the flow rate of the fluid 2 is disposed in the part 35 of the circulation passage 20 that connects the heat radiation portion 26 and the window portion 22 to each other. Thus, in the cooling device 100, the flow rate of the fluid 2 can be controlled by the orifice 60 such that the vapor-liquid interface P1 is present in each channel portion 24a, and the vapor-liquid interface P2 is present in the heat radiation portion 26.

In the cooling device 100, the orifice 60 is disposed in a part (second connection portion 32) of the circulation passage 20 that connects the heat radiation portion 26 and the liquid transport portion 28 to each other. Thus, in the cooling device 100, the flow rate of the fluid 2 can be controlled such that the vapor-liquid interface P2 is present in the heat radiation portion 26.

1.2. Modification Examples

1.2.1. First Modification Example

Figure 3:
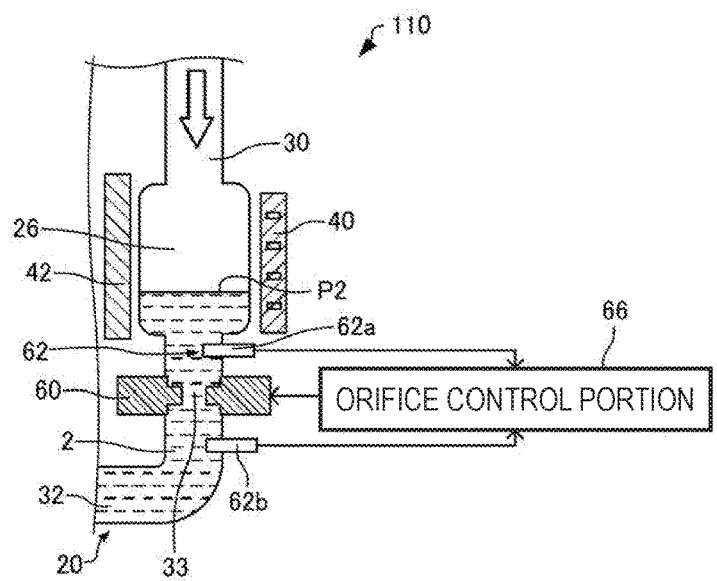
FIG. 3 is a view schematically illustrating a cooling device according to a first modification example of the first embodiment.

Next, a cooling device according to a first modification example of the first embodiment will be described with reference to the drawings. FIG. 3 is a view schematically illustrating a cooling device 110 according to the first modification example of the first embodiment.

Hereinafter, in the cooling device 110 according to the first modification example of the first embodiment, members having the same function as the constituents of the cooling device 100 according to the first embodiment will be designated by the same reference signs, and detailed descriptions of such members will not be repeated. The same applies to cooling devices according to second and third modification examples of the first embodiment described below.

As illustrated in FIG. 3, the cooling device 110 is different from the cooling device 100 in that the cooling device 110 includes a flowmeter 62 and an orifice control portion 66 controlling the orifice 60.

The flowmeter 62 measures the flow rate of the fluid 2. In the illustrated example, the flowmeter 62 includes a first pressure measuring portion 62a and a second pressure measuring portion 62b and measures the flow rate of the fluid 2 using the difference between a pressure measured by the first pressure measuring portion 62a and a pressure measured by the second pressure measuring portion 62b. The pressure measuring portions 62a and 62b are, for example, known pressure gauges. The first pressure measuring portion 62a is disposed between the heat radiation portion 26 and the narrowed portion 33 of the second connection portion 32. The second pressure measuring portion 62b is disposed between the narrowed portion 33 and the liquid transport portion 28 of the second connection portion 32.

The orifice control portion 66 controls the orifice depending on the output of the flowmeter 62. Specifically, the orifice control portion 66 controls the opening of the orifice 60 (the sectional area of the narrowed portion 33) such that the flow rate measured by the flowmeter 62 is constant. The orifice control portion 66 is implemented using, for example, an integrated circuit (IC).

In the cooling device 110, the orifice control portion 66 controls the orifice 60 depending on the output of the flowmeter 62. Thus, in the cooling device 110, the opening of the orifice 60 can be automatically controlled by the orifice control portion 66 such that the flow rate measured by the flowmeter 62 is constant.

1.2.2. Second Modification Example

Figure 4:
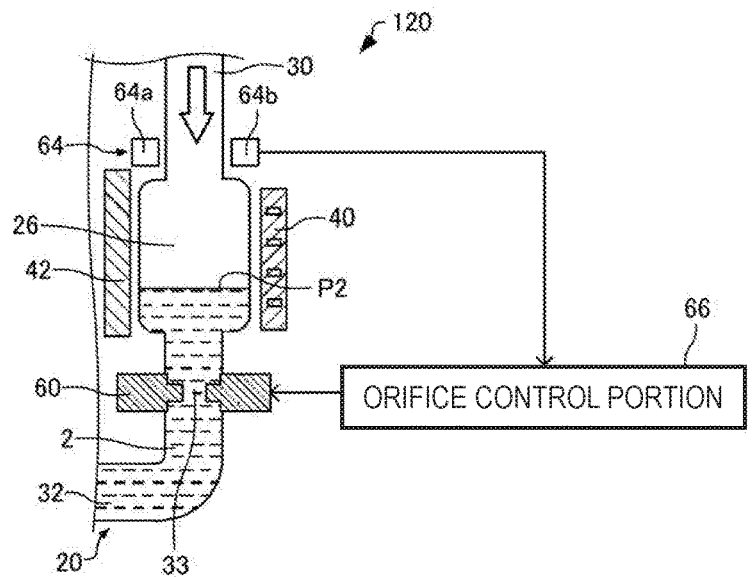
FIG. 4 is a view schematically illustrating a cooling device according to a second modification example of the first embodiment.

Next, a cooling device according to a second modification example of the first embodiment will be described with reference to the drawings. FIG. 4 is a view schematically illustrating a cooling device 120 according to the second modification example of the first embodiment.

As illustrated in FIG. 4, the cooling device 120 is different from the cooling device 100 in that the cooling device 120 includes a liquid level gauge 64 and the orifice control portion 66 controlling the orifice 60.

The liquid level gauge 64 measures the height (position) of the vapor-liquid interface (liquid surface) P2 of the fluid 2 in the heat radiation portion 26. In the illustrated example, the liquid level gauge 64 includes a light emission portion 64a and a light reception portion 64b and measures the height of the vapor-liquid interface P2 by causing light emitted from the light emission portion 64a to be reflected on the vapor-liquid interface P2 and detecting the reflected light in the light reception portion 64b. The configuration of the liquid level gauge 64 is not particularly limited. For example, the liquid level gauge 64 may be a float liquid level gauge or a liquid level gauge that measures the height of the vapor-liquid interface P2 by detecting a pressure (liquid pressure) received by a diaphragm.

The orifice control portion 66 controls the orifice depending on the output of the liquid level gauge 64. Specifically, the orifice control portion 66 controls the opening of the orifice 60 (the sectional area of the narrowed portion 33) such that the height of the vapor-liquid interface P2 measured by the liquid level gauge 64 does not change (is constant). The orifice control portion 66 is implemented using, for example, an IC.

In the cooling device 120, the orifice control portion 66 controls the orifice 60 depending on the output of the liquid level gauge 64. Thus, in the cooling device 120, the opening of the orifice 60 can be automatically controlled by the orifice control portion 66 such that the height of the vapor-liquid interface P2 measured by the liquid level gauge 64 does not change.

1.2.3. Third Modification Example

Figure 5:
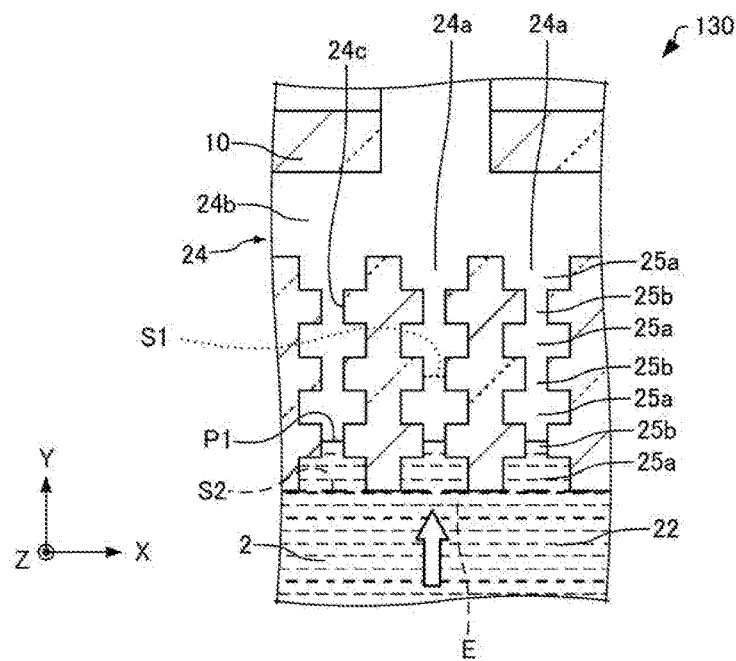
FIG. 5 is a sectional view schematically illustrating a cooling device according to a third modification example of the first embodiment.

Next, a cooling device according to a third modification example of the first embodiment will be described with reference to the drawings. FIG. 5 is a sectional view schematically illustrating a cooling device 130 according to the third modification example of the first embodiment.

As illustrated in FIG. 5, the cooling device 130 is different from the cooling device 100 in that each channel portion 24a has a structure in which wide portions 25a and narrow portions 25b are repeated in the Y axis direction. The wide portions 25a and the narrow portions 25b are alternately disposed in the direction of flow of the fluid 2.

The sectional area of each narrow portion 25b is less than the sectional area of each wide portion 25a. The sectional areas of each wide portion 25a and each narrow portion 25b are less than the sectional area of the boundary E. The number of wide portions 25a and the number of narrow portions 25b are not particularly limited. In the illustrated example, the vapor-liquid interface P1 is present in the narrow portions 25b.

In the cooling device 130, the wide portions 25a and the narrow portions 25b of each channel portion 24a are alternately disposed in the direction of flow of the fluid 2. Thus, in the cooling device 130, the area of contact between the stack body 10 defining the evaporation portion 24 and the liquid part of the fluid 2 can be increased in the evaporation portion 24, compared to that in a case where the wide portions 25a and the narrow portions 25b are not disposed. Thus, in the cooling device 130, it is more unlikely that the vapor-liquid interface P1 moves to the window portion 22 side due to interface tension in the interface between the stack body 10 defining the evaporation portion 24 and the liquid part of the fluid 2.

2. Second Embodiment

2.1. Cooling Device

Figure 6:
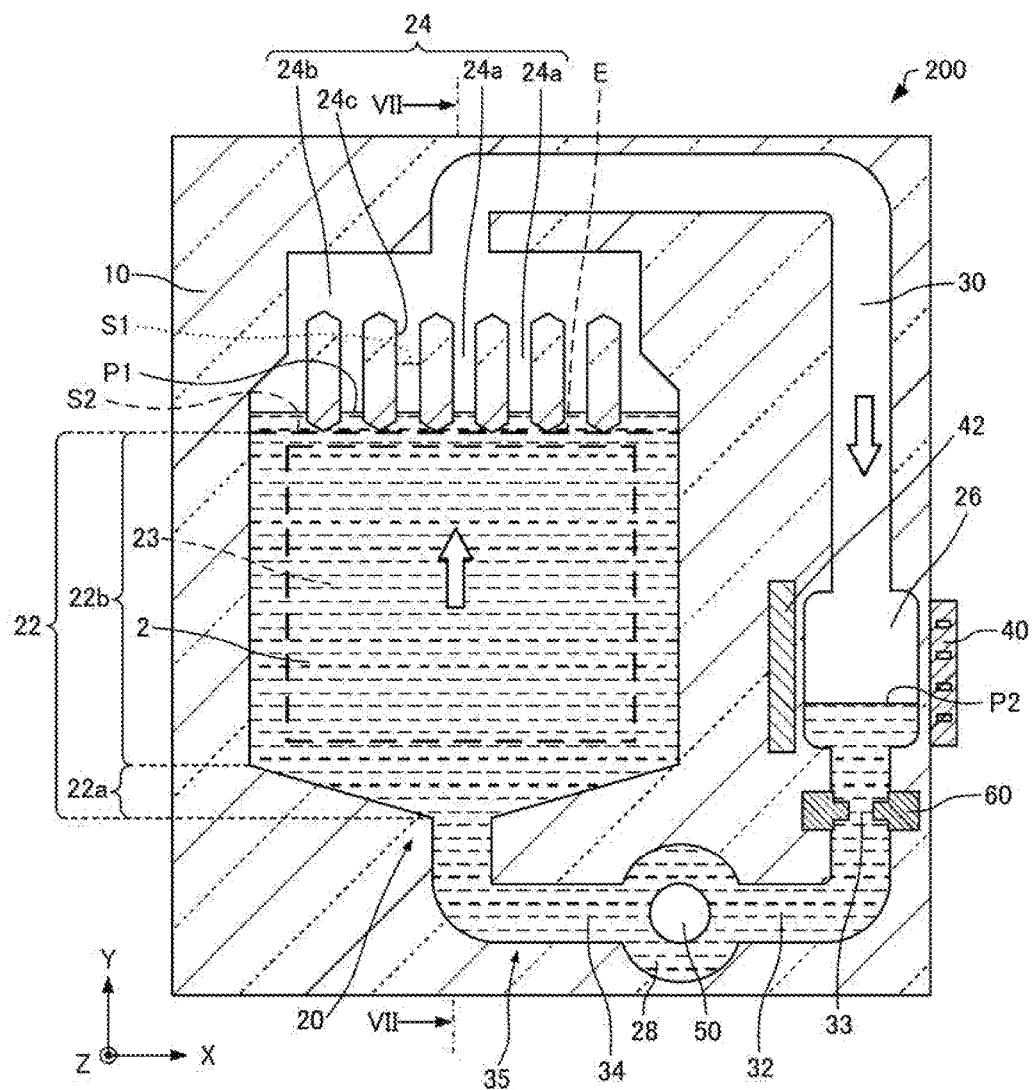
FIG. 6 is a sectional view schematically illustrating a cooling device according to a second embodiment.
Figure 7:
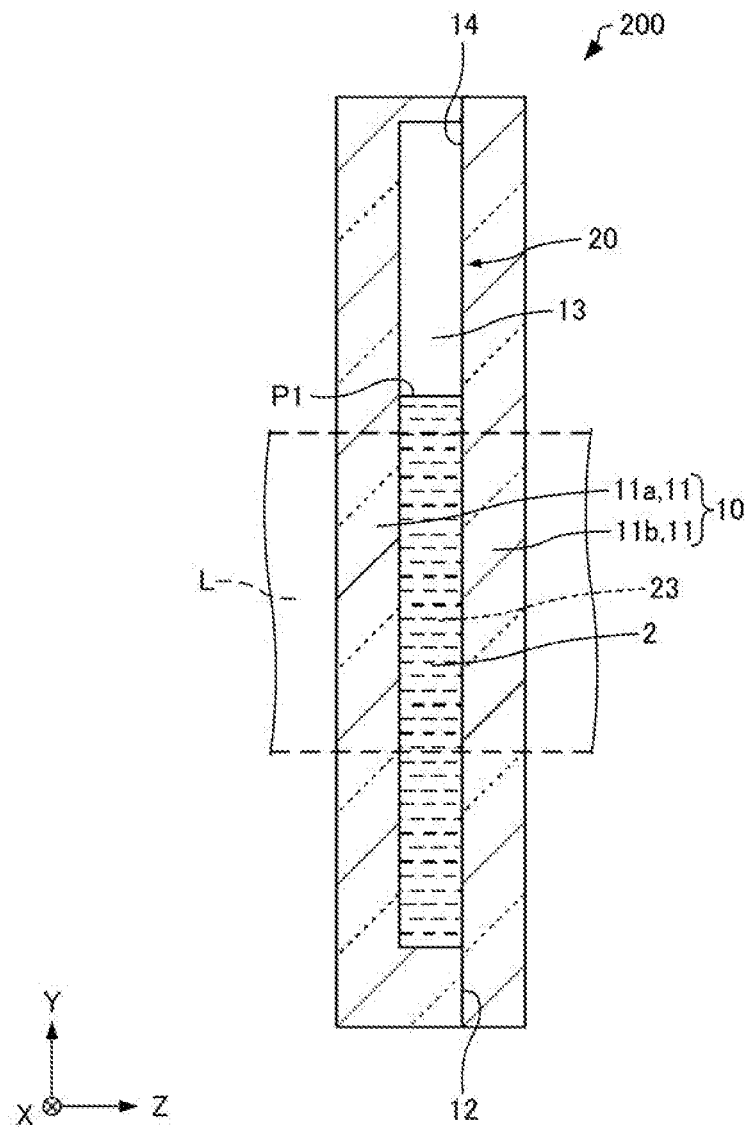
FIG. 7 is a sectional view schematically illustrating the cooling device according to the second embodiment.

Next, a cooling device according to a second embodiment will be described with reference to the drawings. FIG. 6 is a sectional view schematically illustrating a cooling device 200 according to the second embodiment. FIG. 7 is a VII-VII sectional view of FIG. 6 schematically illustrating the cooling device 200 according to the second embodiment.

Hereinafter, in the cooling device 200 according to the second embodiment, members having the same function as the constituents of the cooling device 100 according to the first embodiment will be designated by the same reference signs, and detailed descriptions of such members will not be repeated.

In the cooling device 100, the heat radiation portion 26 and the liquid transport portion 28 are not disposed inside the stack body 10 as illustrated in FIG. 1. Meanwhile, in the cooling device 200, the window portion 22, the evaporation portion 24, the heat radiation portion 26, the liquid transport portion 28, and the connection portions 30, 32, and 34 are disposed inside the stack body 10 as illustrated in FIG. 6 and FIG. 7.

In the illustrated example, the first groove portion 13 constituting the circulation passage 20 is disposed in the first substrate 11a. Groove portions are not disposed in the second substrate 11b.

For example, the cooling device 200 has the following features.

In the cooling device 200, the window portion 22, the evaporation portion 24, and the heat radiation portion 26 are disposed inside the stack body 10. Thus, in the cooling device 200, the window portion 22, the evaporation portion 24, and the heat radiation portion 26 can be formed as a single body. Accordingly, in the cooling device 200, the number of components for forming the circulation passage 20 can be reduced such that the window portion 22 and the evaporation portion 24 are formed as a glass substrate, and the heat radiation portion 26 is formed as another substrate or a pipe, compared to that in a case where the window portion 22, the evaporation portion 24, and the heat radiation portion 26 are not formed as a single body. Therefore, the size of the cooling device 200 can be reduced.

In the cooling device 200, the first groove portion 13 constituting the circulation passage 20 is disposed in the first substrate 11a. Thus, in the cooling device 200, the circulation passage 20 can be easily formed by simply working the first substrate 11a.

While illustration is not provided, in the cooling device 110, 120, or 130, the window portion 22, the evaporation portion 24, and the heat radiation portion 26 may be disposed inside the stack body 10 in the same manner as the cooling device 200.

2.2. Modification Examples

2.2.1. First Modification Example

Figure 8:
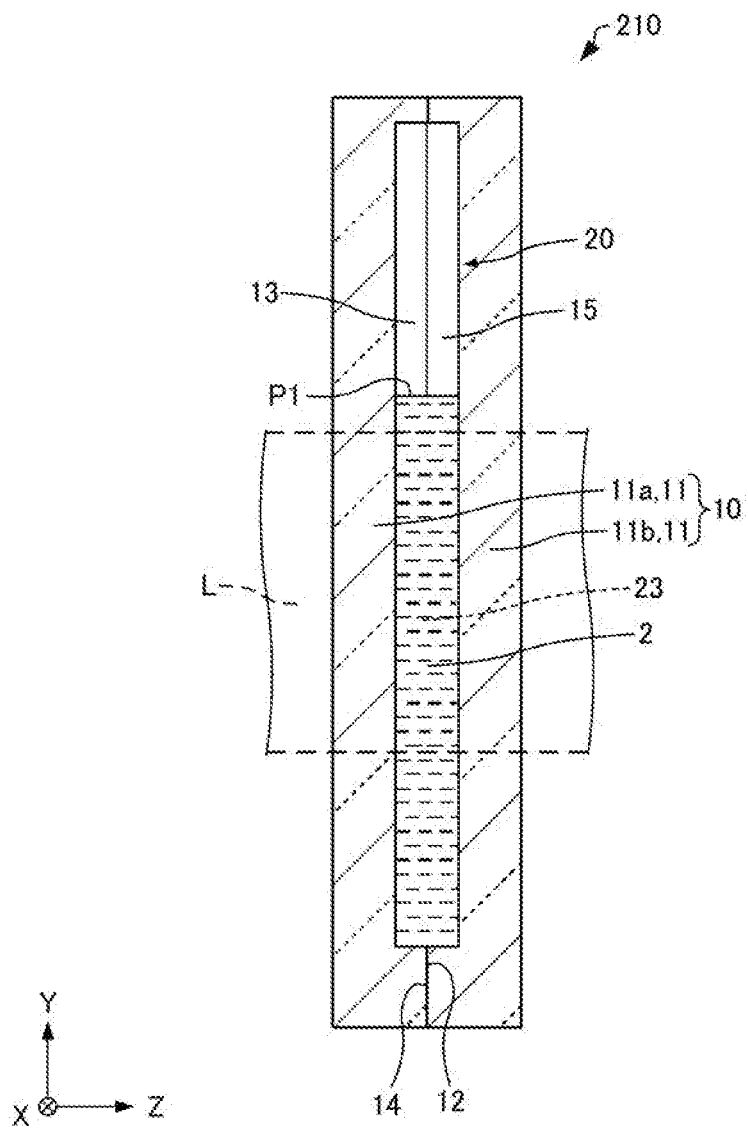
FIG. 8 is a sectional view schematically illustrating a cooling device according to a first modification example of the second embodiment.

Next, a cooling device according to a first modification example of the second embodiment will be described with reference to the drawings. FIG. 8 is a sectional view schematically illustrating a cooling device 210 according to the first modification example of the second embodiment.

Hereinafter, in the cooling device 210 according to the first modification example of the second embodiment, members having the same function as the constituents of the cooling device 200 according to the second embodiment will be designated by the same reference signs, and detailed descriptions of such members will not be repeated. The same applies to a cooling device according to a second modification example of the second embodiment described below.

In the cooling device 200, as illustrated in FIG. 7, the first groove portion 13 constituting the circulation passage 20 is disposed in the first substrate 11a, and groove portions are not disposed in the second substrate 11b. Meanwhile, in the cooling device 210, as illustrated in FIG. 8, the first groove portion 13 constituting the circulation passage 20 is disposed in the first substrate 11a, and a second groove portion 15 that constitutes the circulation passage 20 is disposed in the second substrate 11b.

The second groove portion 15 is disposed on a second surface 14 of the second substrate 11b. The first groove portion 13 and the second groove portion 15 overlap with each other in a plan view seen from the stack direction of the plurality of substrates 11. The first groove portion 13 and the second groove portion 15 communicate with each other.

In the cooling device 210, the second groove portion 15 constituting the circulation passage 20 is disposed in the second substrate 11b. Thus, in the cooling device 210, the circulation passage 20 having a desired sectional area can be formed without increasing the depth of the first groove portion 13 (without increasing the size of the first groove portion 13 in the Z axis direction). Therefore, for example, the cooling device 210 can include the first substrate 11a that is solid.

2.2.2. Second Modification Example

Figure 9:
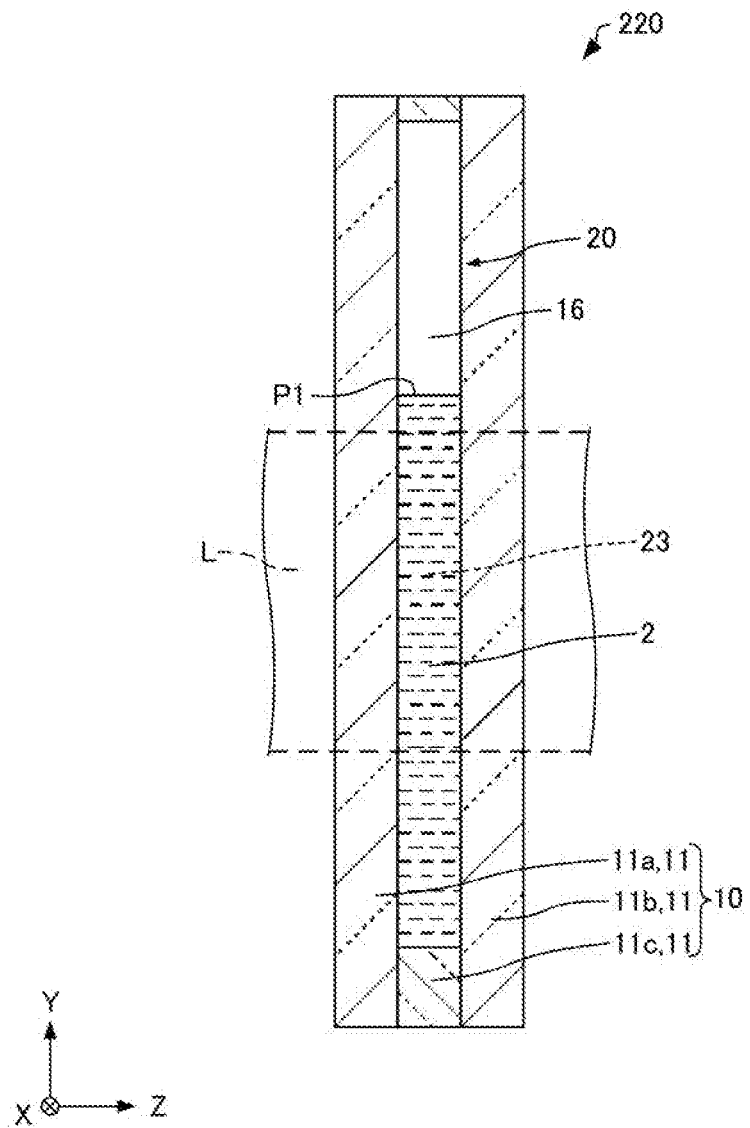
FIG. 9 is a sectional view schematically illustrating a cooling device according to a second modification example of the second embodiment.

Next, a cooling device according to a second modification example of the second embodiment will be described with reference to the drawings. FIG. 9 is a sectional view schematically illustrating a cooling device 220 according to the second modification example of the second embodiment.

In the cooling device 200, the stack body 10 includes the first substrate 11a and the second substrate 11b as illustrated in FIG. 7. Meanwhile, in the cooling device 220, the stack body 10 includes the first substrate 11a, the second substrate 11b, and a third substrate 11c as illustrated in FIG. 9. The third substrate 11c is a third substrate among the plurality of substrates 11.

The third substrate 11c is disposed between the first substrate 11a and the second substrate 11b. The third substrate 11c is joined to the first substrate 11a and the second substrate 11b by, for example, an adhesive. A through hole 16 that constitutes the circulation passage 20 is disposed in the third substrate 11c. The through hole 16 passes through the third substrate 11c in the Z axis direction. In the illustrated example, groove portions are not disposed in the first substrate 11a and the second substrate 11b.

In the cooling device 220, the third substrate 11c is disposed between the first substrate 11a and the second substrate 11b, and the through hole 16 constituting the circulation passage 20 is disposed in the third substrate 11c. Thus, in the cooling device 220, the circulation passage 20 can be easily formed by simply working the third substrate 11c.

While illustration is not provided, a first groove portion that constitutes the circulation passage 20 may be disposed in the first substrate 11a, and the first groove portion and the through hole 16 may communicate with each other. Furthermore, a second groove portion that constitutes the circulation passage 20 may be disposed in the second substrate 11b, and the first groove portion, the second groove portion, and the through hole 16 may communicate with each other.

3. Third Embodiment

3.1. Projector

Figure 10:
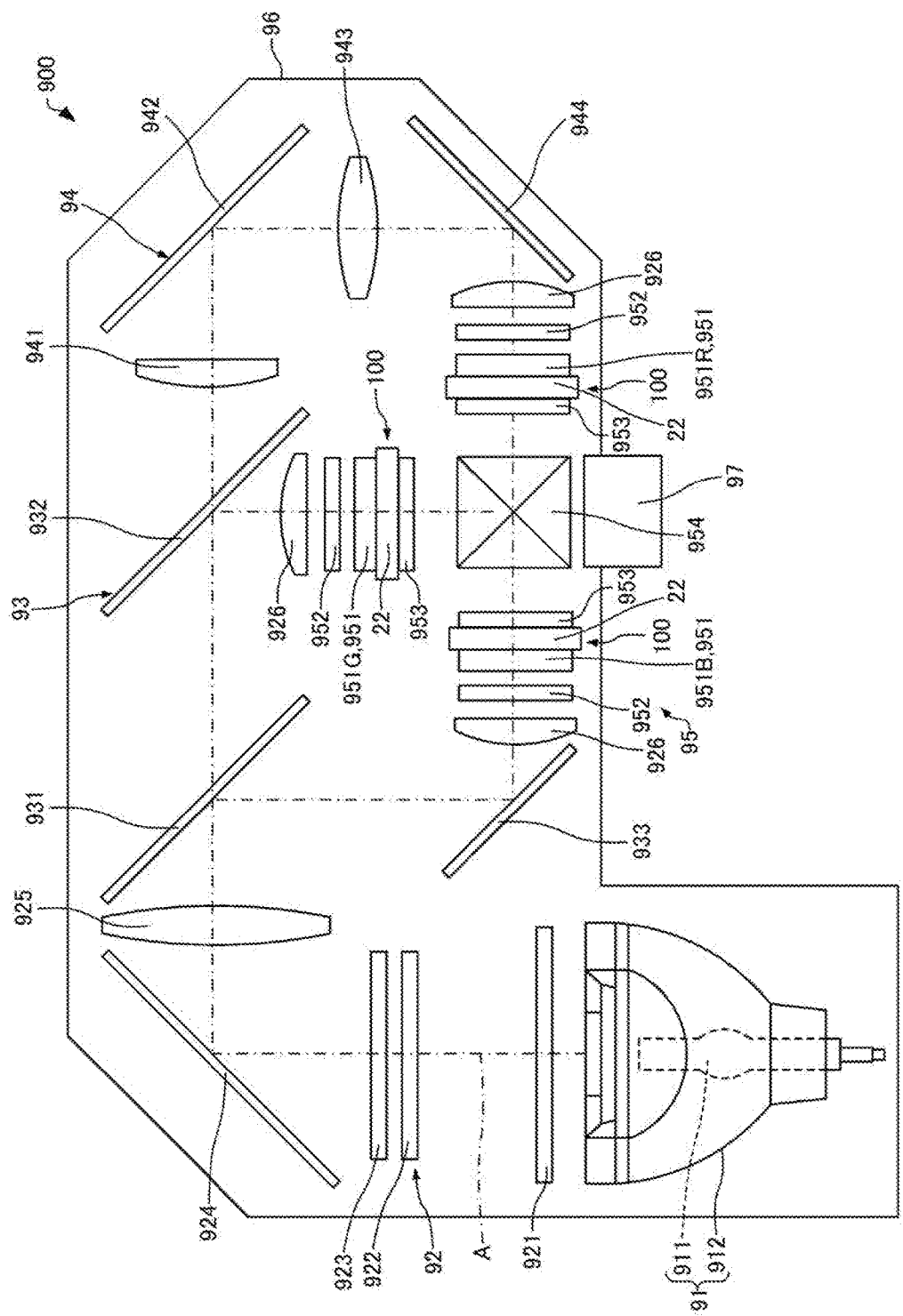
FIG. 10 is a view schematically illustrating a projector according to a third embodiment.

Next, a projector according to a third embodiment will be described with reference to the drawings. FIG. 10 is a sectional view schematically illustrating a projector 900 according to the third embodiment.

A projector according to the invention includes a cooling device according to the invention. Hereinafter, the projector 900 that includes the cooling device 100 as the cooling device according to the invention will be described. In the illustrated example, three cooling devices 100 are disposed. In FIG. 10, the cooling devices 100 are illustrated in a simplified manner for convenience.

As illustrated in FIG. 10, the projector 900 includes a light source device 91, a uniform illumination optical device 92, a color separation optical device 93, a relay optical device 94, an optical device 95, an optical component casing 96, and a projection lens 97.

The light source device 91 illuminates the optical device 95 by emitting a luminous flux (light) radiated from a light source lamp 911 in a constant direction. The light source device 91 is accommodated in the optical component casing 96. The light source device 91 is positioned at a predetermined position (a position at which the central axis of the luminous flux emitted from the light source device 91 matches an illumination light axis A set in the optical component casing 96) with respect to the optical component casing 96. The light source device 91 includes the light source lamp 911 and a reflector 912.

The light source lamp 911 is, for example, a halogen lamp, a metal halide lamp, or a high pressure mercury lamp. The reflector 912 is a parabolic reflector that approximately collimates and reflects the luminous flux emitted from the light source lamp 911. The reflector 912 may be an elliptic surface reflector that reflects the luminous flux emitted from the light source lamp 911 to converge at the predetermined position in combination with a collimating lens.

The uniform illumination optical device 92 is an optical system that divides the luminous flux emitted from the light source device 91 into a plurality of partial luminous fluxes and makes the in-plane illuminance of an illumination area uniform. The uniform illumination optical device 92 includes a first lens array 921, a second lens array 922, a polarization converting element 923, a reflective mirror 924, and a superimposing lens 925.

The first lens array 921 is a luminous flux dividing optical element that divides the luminous flux emitted from the light source device 91 into a plurality of partial luminous fluxes. The first lens array 921 includes a plurality of small lenses that are arranged in a matrix form in a plane orthogonal to the illumination optical axis A.

The second lens array 922 is an optical element that condenses the plurality of partial luminous fluxes divided by the first lens array 921. In the same manner as the first lens array 921, the second lens array 922 includes a plurality of small lenses that are arranged in a matrix form in a plane orthogonal to the illumination optical axis A.

The polarization converting element 923 is a polarization converting element that aligns the polarization direction of each partial luminous flux divided by the first lens array 921 to linearly polarized light in an approximately one direction. While specific illustration is not provided, the polarization converting element 923 includes a polarization converting element array having a plate shape, and a retardation plate installed on the luminous flux emission side.

In the polarization converting element array, incident luminous fluxes having random polarization directions are separated into two types of linearly polarized luminous fluxes and emitted. More specifically, the polarization converting element array includes a plurality of polarization separation film arranged in an inclined manner with respect to incident luminous fluxes, reflective films alternately arranged among the polarization separation films, and plate glasses arranged in an interposed manner between each polarization separation film and each reflective film.

Each polarization separation film is configured with a dielectric multilayer film or the like that is set to have a Brewster angle of approximately 45°. Each polarization separation film separates incident luminous fluxes into two types of linearly polarized luminous fluxes such that a linearly polarized luminous flux (S polarized luminous flux) having a polarization direction parallel to an incidence surface of each polarization separation film is reflected, and a linearly polarized luminous flux (P polarized luminous flux) having a polarization direction orthogonal to the S polarized luminous flux is transmitted. Each reflective film is formed of a highly reflective single metal material such as Al, Au, Ag, Cu, or Cr or an alloy including a plurality of these types of metals. Each reflective film reflects the linearly polarized luminous flux (S polarized luminous flux) that is reflected by each polarization separation film. Luminous fluxes pass through the inside of each plate glass. Each plate glass is configured with, for example, a white plate glass.

The retardation plate rotates the polarization direction of the linearly polarized luminous flux (P polarized luminous flux) transmitted through each polarization separation film by 90°. The retardation plate is disposed at a position corresponding to the polarization separation films on the luminous flux emission side end surface of the polarization converting element array.

The superimposing lens 925 is an optical element that condenses the plurality of partial luminous fluxes passing through the first lens array 921, the second lens array 922, the polarization converting element 923, and the reflective mirror 924 and superimposes the condensed luminous flux on image forming areas of three liquid crystal panels of the optical device 95 described below.

The color separation optical device 93 includes two dichroic mirrors 931 and 932 and a reflective mirror 933. The color separation optical device 93 separates the plurality of partial luminous fluxes emitted from the uniform illumination optical device 92 into color light of three colors of red (R), green (G), and blue (B) using the dichroic mirrors 931 and 932.

Each of the dichroic mirrors 931 and 932 is an optical element in which a wavelength selection film that reflects a luminous flux in a predetermined wavelength range onto a substrate and transmits a luminous flux in other wavelength ranges is formed. The dichroic mirror 931 that is arranged on the front stage side of an optical path is a mirror that reflects blue light and transmits other color light. The dichroic mirror 932 that is arranged on the rear stage side of the optical path is a mirror that reflects green light and transmits red light.

The relay optical device 94 includes an incidence side lens 941, a relay lens 943, and reflective mirrors 942 and 944. The relay optical device 94 guides the red light transmitted through the dichroic mirrors 931 and 932 of the color separation optical device 93 to the optical device 95.

The reason for disposing the relay optical device 94 on the optical path of red light is that since the length of the optical path of red light is greater than the length of the optical path of other color light, a decrease in the efficiency of use of light caused by divergence of light is prevented. While such a configuration is used in the present embodiment since the length of the optical path of red light is large, a configuration in which the relay optical device 94 is used for the optical path of blue light by increasing the length of the optical path of blue light may be used.

Blue light that is separated by the dichroic mirror 931 is bent by the reflective mirror 933 and then, is supplied to the optical device 95 through a field lens 926. Green light that is separated by the dichroic mirror 932 is supplied to the optical device 95 through the field lens 926. Red light is condensed and bent by the lenses 941 and 943 and the reflective mirrors 942 and 944 constituting the relay optical device 94 and is supplied to the optical device 95 through the field lens 926.

The field lens 926 that is disposed in the front stage of the optical path of each color light in the optical device 95 is disposed in order to convert each partial luminous flux emitted from the second lens array 922 into a luminous flux that is parallel to the principal ray of each partial luminous flux.

The optical device 95 forms a color image by modulating an incident luminous flux depending on image information. The optical device 95 includes three liquid crystal panels (light modulation devices) 951, an incidence side polarization plate 952 arranged on the front stage side of the optical path of each liquid crystal panel 951, an emission side polarization plate 953 arranged on the rear stage side of the optical path of each liquid crystal panel 951, and a cross dichroic prism (color combining optical device) 954. In FIG. 10, the liquid crystal panel on the red light side is denoted by 951R. The liquid crystal panel on the green light side is denoted by 951G. The liquid crystal panel on the blue light side is denoted by 951B.

Each incidence side polarization plate 952 transmits only polarized light having approximately the same polarization direction as the polarization direction aligned by the polarization converting element 923 and absorbs other luminous fluxes among each color light separated by the color separation optical device 93. For example, each incidence side polarization plate 952 is configured by bonding a polarization film onto a light transmitting substrate.

Each liquid crystal panel 951, while specific illustration is not provided, has a configuration in which liquid crystal which is an electro-optic substance is airtightly sealed in a pair of substrates that are formed of glass or the like and have rectangular shapes in a plan view. In each liquid crystal panel, the orientation state of the liquid crystal is controlled, and the polarization direction of the polarized luminous flux emitted from each incidence side polarization plate 952 is modulated.

Each emission side polarization plate 953 has approximately the same function as each incidence side polarization plate 952 such that each emission side polarization plate 953 transmits polarized light in a constant direction and absorbs other luminous fluxes among the luminous fluxes emitted through each liquid crystal panel 951. For example, each emission side polarization plate 953 is configured by bonding a polarization film onto a light transmitting substrate.

The cross dichroic prism 954 forms a color image by combining each modulated color light for each color light emitted from each emission side polarization plate 953. The cross dichroic prism 954 has an approximately square shape in a plan view by bonding four right angle prisms. Two dielectric multilayer films are formed in interfaces between the bonded right angle prisms. These dielectric multilayer films transmit color light that is emitted from the liquid crystal panel 951G and passes through the emission side polarization plate 953, and reflect each color light that is emitted from the liquid crystal panels 951R and 951B and passes through the emission side polarization plates 953. By doing so, each color light is combined, and a color image is formed. The color image formed by the cross dichroic prism 954 is projected in an enlarged manner to a screen by the projection lens 97.

The optical component casing 96 accommodates the light source device 91, the uniform illumination optical device 92, the color separation optical device 93, the relay optical device 94, and the optical device 95. For example, the projection lens 97 is attached to the optical component casing 96.

Each cooling device 100 cools, for example, each liquid crystal panel 951 and each emission side polarization plate 953. That is, a plurality of optical elements that are cooled by each cooling device 100 are disposed. A first optical element among the plurality of optical elements is the liquid crystal panel 951, and a second optical element among the plurality of optical elements is the emission side polarization plate 953. The window portion 22 of each cooling devices 100 is disposed between each liquid crystal panel 951 and each emission side polarization plate 953.

For example, each window portion 22 is in contact with each liquid crystal panel 951 and each emission side polarization plate 953. Three cooling devices 100 are disposed in correspondence with three liquid crystal panels 951.

For example, the projector 900 has the following features.

The projector 900 includes the cooling devices 100 that can reduce the effect of air bubbles on the light L transmitted through the window portions 22. Thus, the projector 900 can reduce distortion of a video caused by air bubbles.

In the projector 900, the window portion 22 of each cooling devices 100 is disposed between each liquid crystal panel 951 and each emission side polarization plate 953. Thus, in the projector 900, one cooling device 100 can cool each liquid crystal panel 951 and each emission side polarization plate 953. Accordingly, in the projector 900, the reliability of each liquid crystal panel 951 and each emission side polarization plate 953 can be increased.

Each emission side polarization plate 953 is more likely to emit heat than each incidence side polarization plate 952. The reason is that since each emission side polarization plate 953 absorbs light depending on modulation in each liquid crystal panel 951, the amount of absorbed light is likely to be larger than that of each incidence side polarization plate 952. In the projector 900, since each cooling device 100 cools each emission side polarization plate 953, deterioration of polarization characteristics caused by heat can be reduced, compared to that in a case where each cooling device 100 cools each incidence side polarization plate 952.

While illustration is not provided, each cooling device 100 may cool each liquid crystal panel 951 only, may cool each incidence side polarization plate 952 only, may cool each emission side polarization plate 953 only, or may cool only the polarization plates 952 and 953.

While illustration is not provided, an angle of view compensation plate that compensates a difference in phase between ordinary light and extraordinary light caused by birefringence occurring in each liquid crystal panel 951 and improves the clarity characteristics of each liquid crystal panel 951 may be disposed on the rear stage side of the optical path of each liquid crystal panel 951.

While an example in which the light source device 91 is configured to include the light source lamp 911 is described above, the light source device 91 may be configured to include a semiconductor light emission element such as a laser diode (LD), a super luminescent diode (SLD), or a light emitting diode (LED). In this case, three semiconductor light emission elements may be disposed, and the three semiconductor light emission elements may emit red light, green light, and blue light, respectively.

3.2. Modification Example

Figure 11:
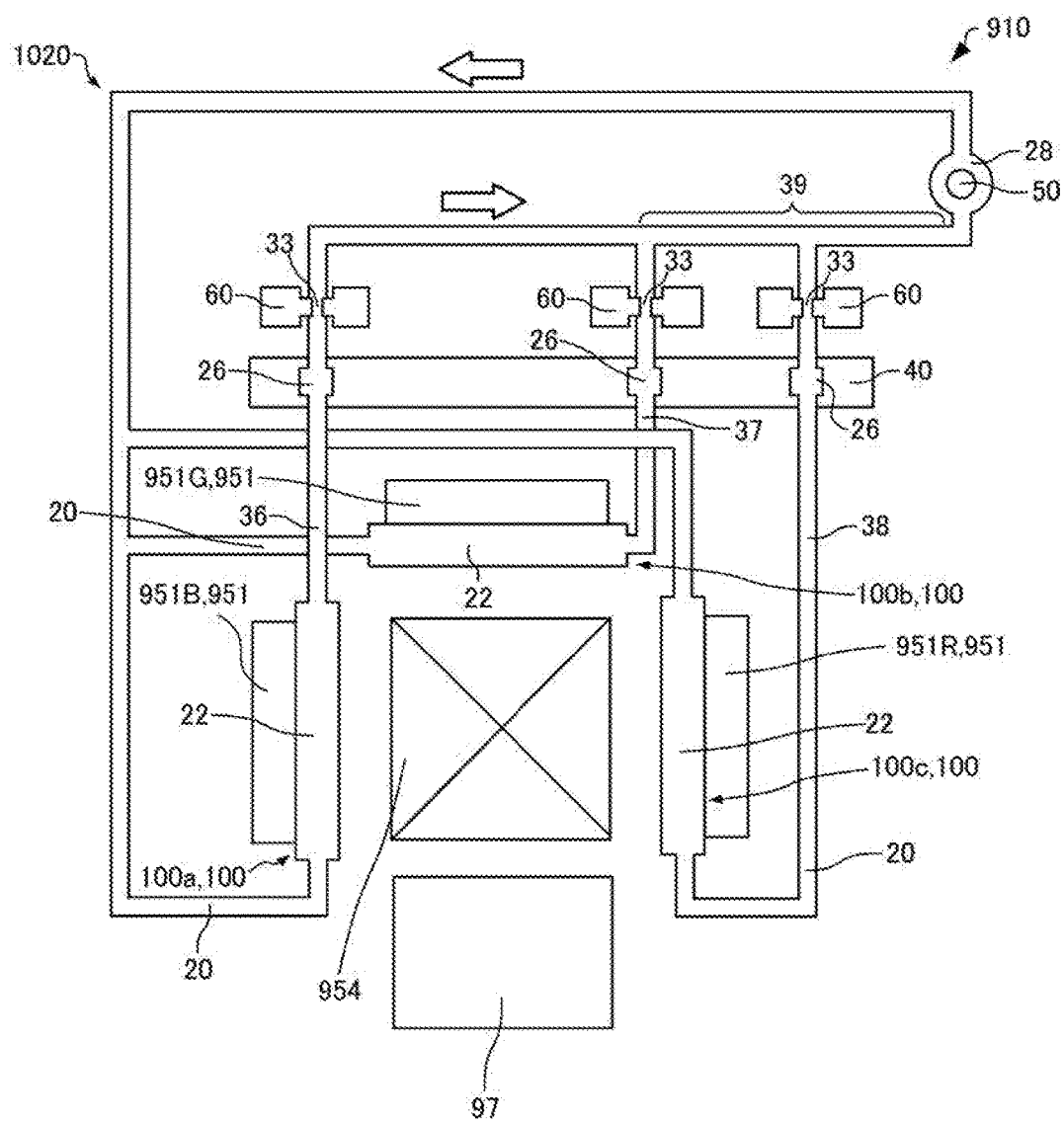
FIG. 11 is a view schematically illustrating a projector according to a modification example of the third embodiment.

Next, a projector according to a modification example of the third embodiment will be described with reference to the drawings. FIG. 11 is a view schematically illustrating a projector 910 according to the modification example of the third embodiment. In FIG. 11, only the cooling devices 100, the liquid crystal panels 951, the cross dichroic prism 954, and the projection lens 97 are illustrated for convenience. In FIG. 11, each cooling device 100 is illustrated in a simplified manner. In FIG. 11, the direction in which the fluid 2 flows is illustrated by arrows.

Hereinafter, in the projector 910 according to the modification example of the third embodiment, members having the same function as the constituents of the projector 900 according to the third embodiment will be designated by the same reference signs, and descriptions of such members will not be repeated.

In the projector 900, the circulation passages 20 of three cooling devices 100 are separated from each other. Meanwhile, in the projector 910, the circulation passages 20 of three cooling devices 100 (cooling devices 100a, 100b, and 100c) communicate with each other and constitute a communicating passage 1020 as illustrated in FIG. 11.

A common pump 50 that transports the fluid 2 (not illustrated in FIG. 11) to the window portions 22 of three cooling devices 100 is disposed in the communicating passage 1020. The communicating passage 1020 includes one liquid transport portion 28 and three window portions 22.

The communicating passage 1020 includes a fourth connection portion 36, a fifth connection portion 37, and a sixth connection portion 38. The fourth connection portion 36 connects the window portion 22 of the cooling device 100a and the liquid transport portion 28 to each other. The fifth connection portion 37 connects the window portion 22 of the cooling device 100b and the liquid transport portion 28 to each other. The sixth connection portion 38 connects the window portion 22 of the cooling device 100c and the liquid transport portion 28 to each other. The connection portions 36, 37, and 38 have a common part 39 that is a common part of at least two of the connection portions 36, 37, and 38.

The orifice 60 is disposed in each of the connection portions 36, 37, and 38 of the communicating passage 1020. Each orifice 60 is disposed by avoiding the common part 39. For example, the orifice 60 disposed in the fourth connection portion 36 controls the flow rate of the fluid 2 flowing through the window portion 22 of the cooling device 100a. For example, the orifice 60 disposed in the fifth connection portion 37 controls the flow rate of the fluid 2 flowing through the window portion 22 of the cooling device 100b. For example, the orifice 60 disposed in the sixth connection portion 38 controls the flow rate of the fluid 2 flowing through the window portion 22 of the cooling device 100c.

The heat exchanger 40 is disposed in the vicinity of the heat radiation portion 26 that is disposed in each of the connection portions 36, 37, and 38 of the communicating passage 1020. The heat exchanger 40 is a common heat exchange in the circulation passages 20 of three cooling devices 100.

In the projector 910, the common pump 50 transporting the fluid 2 to each window portion 22 is disposed in the circulation passages 20 of three cooling devices 100, and the orifice 60 is disposed in each circulation passage 20 of three cooling devices 100. Thus, in the projector 910, the number of pumps 50 can be reduced, compared to that in a case where three pumps 50 are disposed, and the flow rate of the fluid 2 flowing through three window portions 22 can be controlled by three orifices 60. Each liquid crystal panel 951 has a different amount of heat emission depending on the color of light passing therethrough. In the projector 910, the flow rate of the fluid 2 can be individually controlled by three orifices 60 such that the flow rate of each of three window portions is set to a value appropriate for the amount of heat emission of each liquid crystal panel 951.

While illustration is not provided, the cooling device according to the invention may cool an optical element that is included in an apparatus other than the projector.

The invention may be configured by removing a part of its configuration or combining the embodiments and the modification examples with each other, provided that the features and effects disclosed in the present application are achieved.

The invention includes a configuration that is substantially the same as the configuration described in the embodiments (for example, a configuration having the same function, the same method, and the same result or a configuration having the same advantage and the same effect). The invention also includes a configuration configured by replacing a non-substantial part of the configuration described in the embodiments. The invention also includes a configuration that accomplishes the same effect or achieves the same advantage as the configuration described in the embodiments. The invention also includes a configuration that is configured by adding a known technology to the configuration described in the embodiments.

The entire disclosure of Japanese Patent Application No. 2017-254561, filed Dec. 28, 2017 is expressly incorporated by reference herein.

What is claimed is:

1. A cooling device of an optical element, comprising:
   a circulation passage through which a fluid circulates,
   wherein the circulation passage includes
      a window portion that is disposed on an incidence side or an emission side of the optical element and transmits light,
      an evaporation portion that is connected to the window portion and includes a plurality of channel portions, and
      a heat radiation portion that radiates heat of the fluid,
   the window portion, the evaporation portion, and the heat radiation portion are disposed in an order of the window portion, the evaporation portion, and the heat radiation portion in a circulation direction of the fluid,
   the fluid transmits the light in a liquid state,
   the fluid is a liquid in the window portion,
   the fluid that is a liquid evaporates to vapor in the plurality of channel portions,
   the fluid that is vapor condenses into a liquid in the heat radiation portion, and
   a sectional area of each channel portion is less than a sectional area of a boundary between the window portion and the evaporation portion.

2. The cooling device according to claim 1,
   wherein the sectional area of each channel portion is greater than or equal to 0.008 mm$^2$ and less than or equal to 0.1 mm$^2$, and
   the sectional area of the boundary between the window portion and the evaporation portion is greater than or equal to 1.2 mm$^2$ and less than or equal to 55 mm$^2$.

3. The cooling device according to claim 1,
   wherein a pump that transports the fluid to the window portion is disposed in a part of the circulation passage that connects the heat radiation portion and the window portion.

4. The cooling device according to claim 3,
   wherein an orifice that controls a flow rate of the fluid is disposed in the part of the circulation passage that connects the heat radiation portion and the window portion.

5. The cooling device according to claim 4,
   wherein the circulation passage includes a liquid transport portion in which the pump is disposed, and
   the orifice is disposed in a part of the circulation passage that connects the heat radiation portion and the liquid transport portion.

6. The cooling device according to claim 4, further comprising:
   a control portion that controls the orifice; and
   a flowmeter that measures the flow rate of the fluid,
   wherein the control portion controls the orifice depending on output of the flowmeter.

7. The cooling device according to claim 4, further comprising:
   a control portion that controls the orifice; and
   a liquid level gauge that measures a height of a liquid surface of the fluid in the heat radiation portion,
   wherein the control portion controls the orifice depending on output of the liquid level gauge.

8. The cooling device according to claim 1, further comprising:
    a stack body in which a plurality of substrates are stacked,
    wherein the circulation passage is disposed in the stack body, and
    the window portion, the evaporation portion, and the heat radiation portion are disposed inside the stack body.
9. The cooling device according to claim 8,
    wherein a first groove portion that constitutes the circulation passage is disposed in a first substrate among the plurality of substrates.
10. The cooling device according to claim 9,
    wherein a second groove portion that constitutes the circulation passage is disposed in a second substrate among the plurality of substrates, and
    the first groove portion and the second groove portion overlap in a plan view seen from a stack direction of the plurality of substrates.
11. A projector comprising:
    the cooling device according to claim 1.
12. A projector comprising:
    the cooling device according to claim 2.
13. A projector comprising:
    the cooling device according to claim 3.
14. A projector comprising:
    the cooling device according to claim 4.
15. A projector comprising:
    the cooling device according to claim 5.
16. The projector according to claim 11,
    wherein the optical element is a liquid crystal panel.
17. The projector according to claim 16,
    wherein three optical elements are disposed, and
    three cooling devices are disposed in correspondence with the three optical elements.
18. The projector according to claim 17,
    wherein a common pump that transports the fluid to the window portions is disposed in the circulation passages of the three cooling devices, and
    an orifice that controls a flow rate of the fluid is disposed in each circulation passage of the three cooling devices.
19. The projector according to claim 11,
    wherein the optical element is a polarization plate.
20. The projector according to claim 11,
    wherein a plurality of the optical elements are disposed,
    a first optical element among the plurality of optical elements is a liquid crystal panel,
    a second optical element among the plurality of optical elements is a polarization plate, and
    the window portion is disposed between the first optical element and the second optical element.

* * * * *